United States Patent [19]
Yu et al.

[11] Patent Number: 5,636,320
[45] Date of Patent: Jun. 3, 1997

[54] SEALED CHAMBER WITH HEATING LAMPS PROVIDED WITHIN TRANSPARENT TUBES

[75] Inventors: Chienfan Yu, Highland Mills; David E. Kotecki, Hopewell Junction; Wesley C. Natzle, New Paltz, all of N.Y.

[73] Assignee: International Business Machines Corporation, Armonk, N.Y.

[21] Appl. No.: 452,466

[22] Filed: May 26, 1995

[51] Int. Cl.⁶ .................... H01L 21/205; F26B 19/00; F27D 1/00
[52] U.S. Cl. ............ 392/416; 219/390; 118/50.1; 118/724; 373/127; 427/557
[58] Field of Search .................... 392/416, 418, 392/407; 219/390, 405, 411; 118/50.1, 724, 725; 432/120; 373/112, 109, 119, 127; 427/557, 559, 521

[56] References Cited

U.S. PATENT DOCUMENTS

| | | | |
|---|---|---|---|
| 2,271,838 | 2/1942 | Hanawalt et al. | 373/127 |
| 2,359,157 | 9/1944 | Roth | 373/112 |
| 2,768,277 | 10/1956 | Buck et al. | 373/112 |
| 3,052,789 | 9/1962 | Trainor et al. | 392/418 |
| 3,353,005 | 11/1967 | Sisson et al. | 219/390 |
| 3,541,293 | 11/1970 | MacDonald et al. | 219/390 |
| 3,626,154 | 12/1971 | Reed | 219/411 |
| 4,081,313 | 3/1978 | McNeilly et al. | 392/416 |
| 4,511,788 | 4/1985 | Arai et al. | 219/405 |
| 4,533,820 | 8/1985 | Shimizu | 219/411 |
| 4,544,418 | 10/1985 | Gibbons | 427/557 |
| 4,550,244 | 10/1985 | Arai et al. | 219/405 |
| 4,558,660 | 12/1985 | Nishizawa | 118/725 |
| 4,818,849 | 4/1989 | Matlen | 392/411 |
| 4,885,454 | 12/1989 | Lavoie et al. | 219/390 |
| 4,906,328 | 3/1990 | Freeman et al. | 427/557 |
| 5,027,746 | 7/1991 | Frijlink | 118/724 |
| 5,057,668 | 10/1991 | Gisdakis et al. | 219/390 |
| 5,259,881 | 11/1993 | Edwards et al. | 118/719 |
| 5,267,609 | 12/1993 | Olsson | 165/133 |
| 5,276,763 | 1/1994 | Gobel et al. | 392/407 |
| 5,282,925 | 2/1994 | Jeng et al. | 156/646 |
| 5,304,279 | 4/1994 | Coultas et al. | 156/345 |
| 5,305,416 | 4/1994 | Fiory | 392/416 |
| 5,340,089 | 8/1994 | Heath et al. | 432/58 |
| 5,455,082 | 10/1995 | Saito et al. | 427/557 |

FOREIGN PATENT DOCUMENTS

| | | | |
|---|---|---|---|
| 399763 | 8/1924 | Germany | 392/416 |
| 62-183513 | 8/1987 | Japan . | |
| 4-225788 | 8/1992 | Japan | 373/127 |
| 86104 | 8/1920 | Switzerland | 373/127 |

*Primary Examiner*—John A. Jeffery
*Attorney, Agent, or Firm*—Alison D. Mortinger

[57] ABSTRACT

A reactor is provided for heating a workpiece in a sealed environment. The reactor has a chamber with a gas inlet port, a gas outlet port, and at least one tube for receiving a heat source. The tube passes from outside the chamber into the inside of the chamber without breaking the chamber seal. Alternately, the tubes may be used for treating the workpiece with light, in combination with or instead of heat treatment.

20 Claims, 2 Drawing Sheets

5,636,320

1

SEALED CHAMBER WITH HEATING LAMPS PROVIDED WITHIN TRANSPARENT TUBES

FIELD OF THE INVENTION

This invention is directed to a radiant heating apparatus, and more specifically to a reactor for processing semiconductor substrates which uses heating lamps disposed within the reactor chamber.

BACKGROUND OF THE INVENTION

In the semiconductor industry, reactors such as vapor phase reactors are used for example to etch films from semiconductor wafers or substrates. In a typical process, a gaseous etchant is admitted to the reactor chamber which will produce the desired chemistry to promote etching. The chamber can be operated at a range of pressures to further promote the reaction, and can also provide wafer heating for the same purpose.

Currently known reactors employ external heating of the chamber, by positioning heaters or lamps close to a transparent wall of the chamber. For example, U.S. Pat. No. 4,558,660 to Nishizawa, et al. entitled "Semiconductor Fabricating Apparatus" describes a quartz glass reaction tube for curing wafers in the presence of a gas, with the wafers being heated by lamps outside the reaction chamber. Cooling is provided either by channeling water through a reflective block positioned on the side of the lamps away from the chamber, or constructing a double-walled chamber and flowing a purified gas through the space in between the walls.

Other prior art using lamps external to the chamber includes: U.S. Pat. No. 5,305,416 to Fiory entitled "Semiconductor Processing Technique, Including Pyrometric Measurement of radiantly Heated Bodies;" U.S. Pat. No. 5,259,881 to Edwards, et al, entitled "Wafer Processing Cluster Tool Batch Preheating and Degassing Apparatus;" U.S. Pat. No. 5,027,746 to Frijlink entitled "Epitaxial Reactor Having a Wall Which is Protected from Deposits;" U.S. Pat. No. 4,533,820 to Shimuzu, entitled "Radiant Heating Apparatus;" U.S. Pat. No. 5,057,668 to Gisdakis, et al entitled "Device for the Implementation of a Curing Process at a Semiconductor Wafer and Method for Curing a Semiconductor Wafer;" and Japanese Patent 62-183513 to Natsuo, et al. entitled "Semiconductor Manufacturing Apparatus."

The prior art utilizes a heat source which is external to the chamber, and thus heating of the chamber is a relatively slow process. In addition, if more than a single wafer is to be processed, the wafers must be substantially coplanar so that the wafers face an array of lamps for even heating. Thus prior art methods are inefficient when large batches (for example 25 wafers in a wafer cassette) need to be processed, and processing time per wafer is very long.

Thus, there remains a need for a reactor that can rapidly heat the wafers inside before, during, or after the reaction process and be cooled down quickly afterwards for efficient processing of wafer batches.

SUMMARY OF THE INVENTION

It is therefore an object of the present invention to provide a reactor with the capability for rapid thermal treatment before, during, or after the reaction process.

It is a further object to provide a reactor that can uniformly process multiple wafers at once.

2

It is another object to provide a reactor that can be rapidly cooled following heat treatment.

It is yet another object to provide a flexible arrangement of heating devices for the chamber that can be easily serviced without affecting the environment inside the chamber.

In accordance with the above listed and other objects, a reactor is provided for heating a workpiece in a sealed environment. The reactor has a chamber with a gas inlet port, a gas outlet port, and at least one tube for receiving a heat source. The tube passes from outside the chamber into the inside of the chamber without breaking the chamber seal. In an alternate embodiment, the tubes can be used to receive a source of illumination of shorter wavelength.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENT

The present invention is described herein in the context of a vapor phase batch reactor for semiconductor processing merely as a specific example, and is not meant to limit applicability of the invention to semiconductor technology. Those skilled in the art will understand that the invention is broadly applicable to any process in which it is desirable to treat a workpiece with heat or illumination in a sealed environment by positioning a heating/illuminating means within the chamber close to the workpiece but without disturbing the chamber environment.

Figure 1:
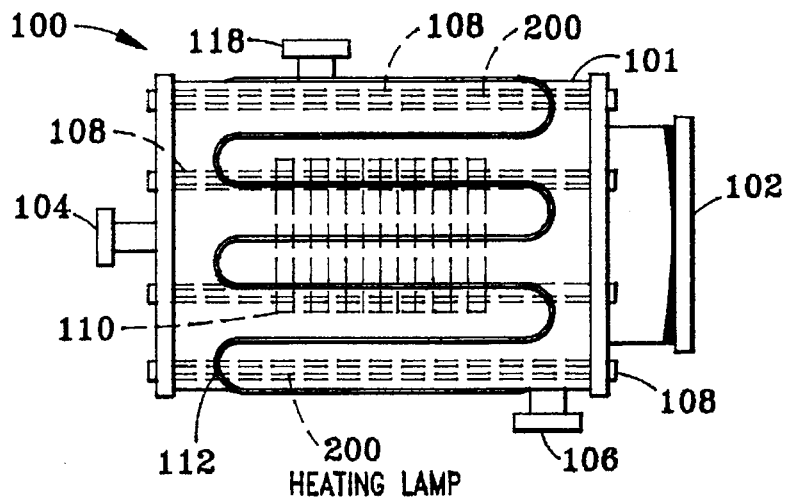
FIGS. 1 and 1A are a side view and end view, respectively, of the vapor reactor.

Referring now to the drawings and more particularly to FIG. 1, a vapor phase reactor for wafer processing is shown. Reactor 100 has an external port 102 through which either a single wafer or a batch of wafers is loaded. Wafers 110 are shown in one possible orientation within the chamber; other orientations are possible as well. To process the wafers 110, a reactant gas is fed into the reactor chamber 100 through inlet port 104. Following the processing of the wafers, under vacuum, excess reactant gas or by-products are pumped out of the chamber through outlet port 106.

Wafer processing may be accomplished via conventional means, for example as described in U.S. Pat. No. 5,282,925 to Jeng at al. entitled "Device and Method for Accurate Etching and Removal of Thin Films," which is assigned to the present assignee and is incorporated herein in its entirety. Generally, Jeng etches oxide from a wafer by admitting reactant vapor to a chamber which forms a film on a wafer. Etching is controlled by controlling the film as well as chamber temperature. After etching is complete, the resulting residue can be removed by thermal desorption.

Figure 2:
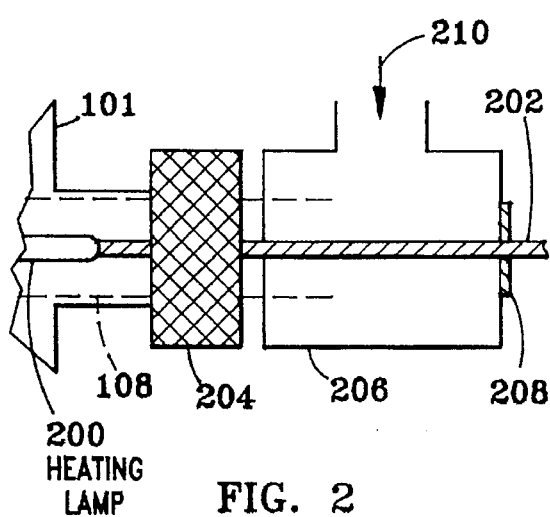
FIG. 2 is a detail of one end of a heating tube adapted for heating and cooling.

Temperature control of the chamber 100 and wafers 110 in the present invention is accomplished via a novel arrangement of tubes 108 for accommodating lamps 200, preferably visible spectrum or infrared lamps (shown in FIG. 2). Infrared or visible lamps are often preferred over ultraviolet lamps so that creation of charged species on the wafers is minimized. However, for certain processes ultraviolet lamps will be preferred, for example where oxygen is admitted to the chamber and ultraviolet light is used to produce ozone. In general, any type of lamp, heating, or illuminating means can be used in the tubes, including microwave and RF (radio frequency) sources. The wavelength of the irradiating light gets shorter as the source is changed through the spectrum of RF, microwave, infrared, visible and ultraviolet.

Heating the wafers 110 with lamps 200 is accomplished through a combination of radiative transmission of light through space to the wafers where the light is absorbed followed by conductive transmission of heat within the wafers. Temperature ramping can be controlled by varying electrical power input to the lamps. Cooling of the chamber can be provided with a jacketed cooling line 112 attached to the outside of the chamber walls 101. Note that the configuration shown in FIG. 1 is merely one example, and any integrated cooling within or on (either inside or outside) the chamber wall will suffice.

The wall 101 (or walls) of the chamber are preferably made of metal to promote thermal conductivity and easier control of the chamber temperature, however they can be a mix of metal and other materials such as a quartz window. Additionally, one or more ports 118 for monitoring the wafers with thermocouples, etc (not shown) may be formed in the wall.

Figure 1A:
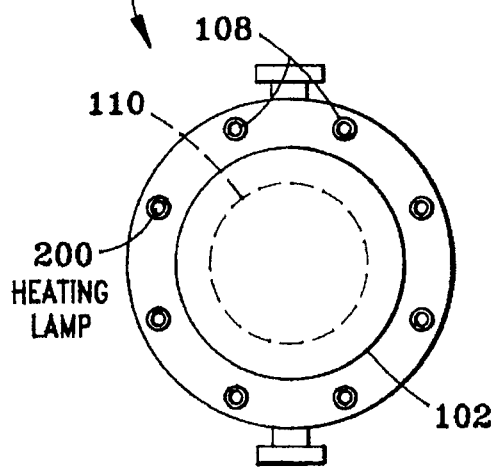

The tubes 108 are preferably made of a transparent material and most preferably made of quartz. The tubes can be closed on one end and not pass entirely through the chamber 100, or can be open to the air outside the reactor chamber, and pass through the chamber wall 101 (with the necessary seals to maintain environmental integrity of the chamber), through the inside of the chamber, and back outside the chamber through another chamber wall as shown in FIG. 1. The arrangement of tubes 108 can be more easily seen in the end view of the chamber 100 as shown in FIG. 1a. With a cylindrical chamber as shown, the tubes are positioned roughly equally around the ring between the perimeter of the external port 102 and the perimeter of the chamber 100. Other configurations may be desirable with other types of reactors, depending on the workpiece to be processed. For example, it may be desirable to have tubes passing through a chamber wall, have a U shape inside the chamber, and exit back through the wall close to where the tube entered. With such an arrangement the heat source would need to be something other than the lamps used with straight tubes as shown in FIG. 1.

Figure 1B:
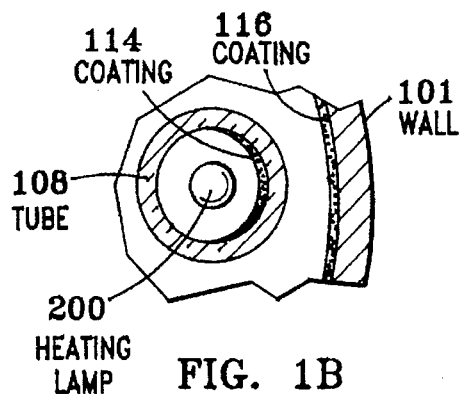
FIG. 1B is an enlargement of the reactor wall and one heating tube.

The efficiency of the lamp heating can be further enhanced by having a reflective coating 114 on the outermost side of the tubes 108, as shown in FIG. 1B preferably on the inner surface as shown to avoid any contamination problems. The interior of the chamber wall 101 can also be coated with a coating 116 which can be a reflective coating or a protective coating such as teflon film to minimize chemical reactions with the wall and lower the adsorption of product species on the wall.

The through-reactor arrangement of tubes 108 illustrated in FIG. 1 provides several advantages. First, the tubes provide vacuum separation of the heating lamps 200 from the chamber ambient, yet provide for closer positioning of the lamps to the workpiece inside the chamber 100. Lamps can be inserted in as many or as few tubes as desired to achieve an optimal temperature profile on the wafers 110. Because the tubes 108 are isolated from the chamber, unlike conventional heating elements which are coupled to the chamber walls, insertion and removal of the lamps from the tubes is easily performed without breaking the vacuum established within the chamber 100.

Chamber cooling is also more efficient. In addition to the chamber wall cooling, the lamps can be cooled by forcing gaseous coolant through the tubes 108 for faster thermal cycling of the chamber 100. Rapid process turnaround is thus easily achieved.

FIG. 2 illustrates how both heating and cooling are integrated in one tube. Tube 108 passes through the chamber wall 101 and a disconnect 204. A lamp 200 is positioned inside the tube, with lead wire 202 connecting the lamp to a power source (not shown). A tee connection 206 is fitted on the end of the tube 108, with a seal 208 for the lead wire. A coolant 210, preferably an inert gas such as dry nitrogen, can then be forced through the tee connection and circulated in the tube 108. The coolant will rapidly cool the lamp 200 and thus speed cooling of the chamber 100. In addition, the life of the lamp will be extended by use of the coolant. Note that coolant in the tubes is not required. However, without cooling the lamps and any seals used will tend to degrade more quickly, and the chamber could not effectively be operated at a wide range of temperatures.

Figure 3:
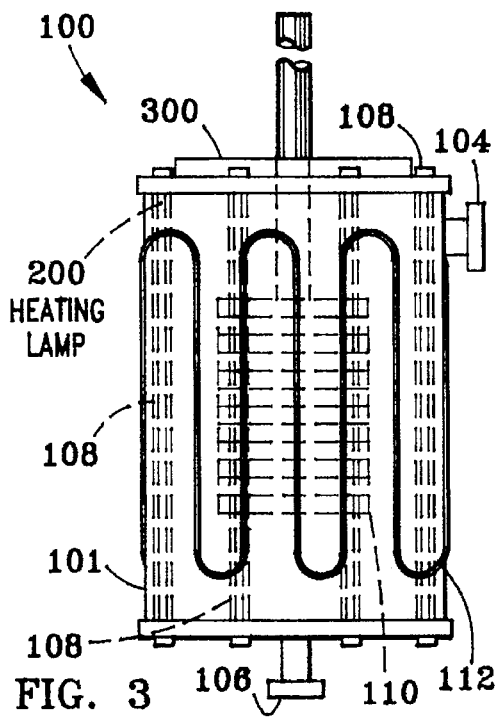
FIG. 3 is an alternate reactor configuration for integrated wafer processing.

An alternate chamber configuration is shown in FIG. 3 which can accommodate automated handling of a wafer stack. The chamber 100 is oriented vertically, and wafers 110 are inserted and removed from the chamber by using a wafer rack or elevator 300. Note that inlet port 104 and outlet port 106 have been relocated to work with the new configuration in FIG. 3, but function the same as the configuration illustrated in FIG. 1. A vertical orientation of the chamber with the wafers placed horizontally therein and face down will produce fewer particles on the wafers' active surfaces.

EXAMPLE 1

Figure 4:
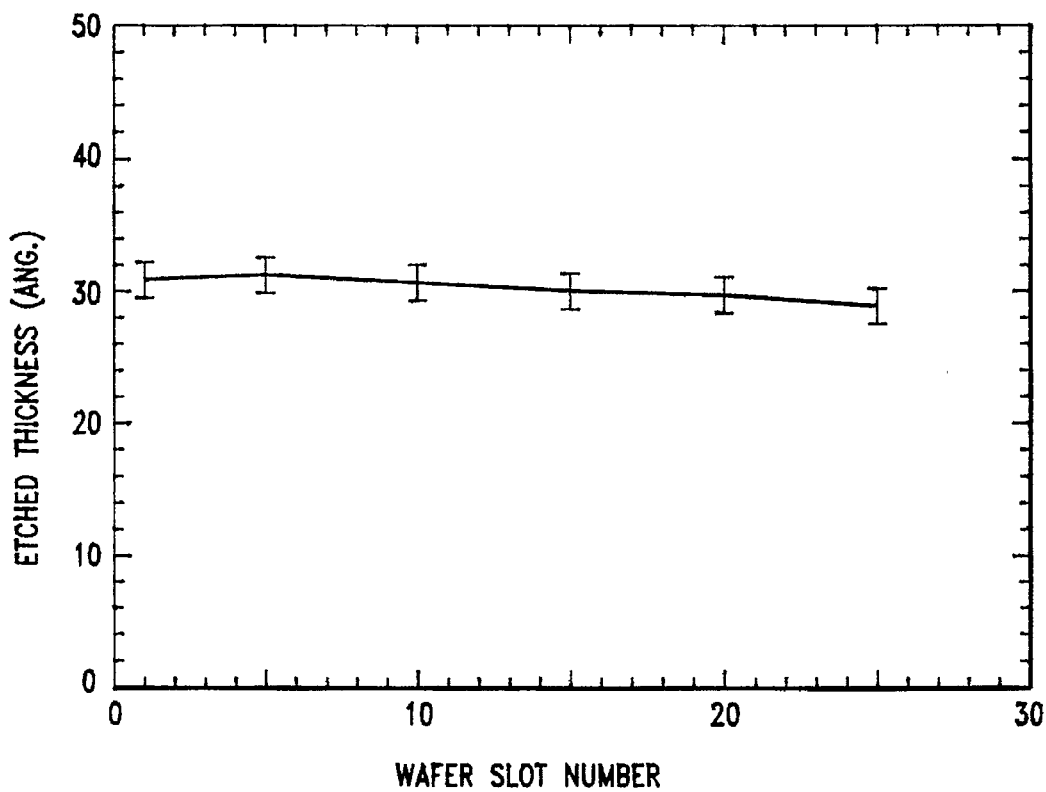
FIG. 4 is a graphical representation showing etch uniformity of a test lot of wafers processed with the vapor reactor.

Using the ammonium biflouride vapor etching process described in Example 1 in Jeng, et al cited above, a 25 wafer lot was processed to remove silicon dioxide film in a vapor phase reactor with through-chamber heating according to the present invention. Six representative wafers from the lot were measured before and after the process with a 49-point Prometrix. As shown in FIG. 4, an average of 30 angstroms of oxide was removed with a standard deviation of 5%.

Figure 5:
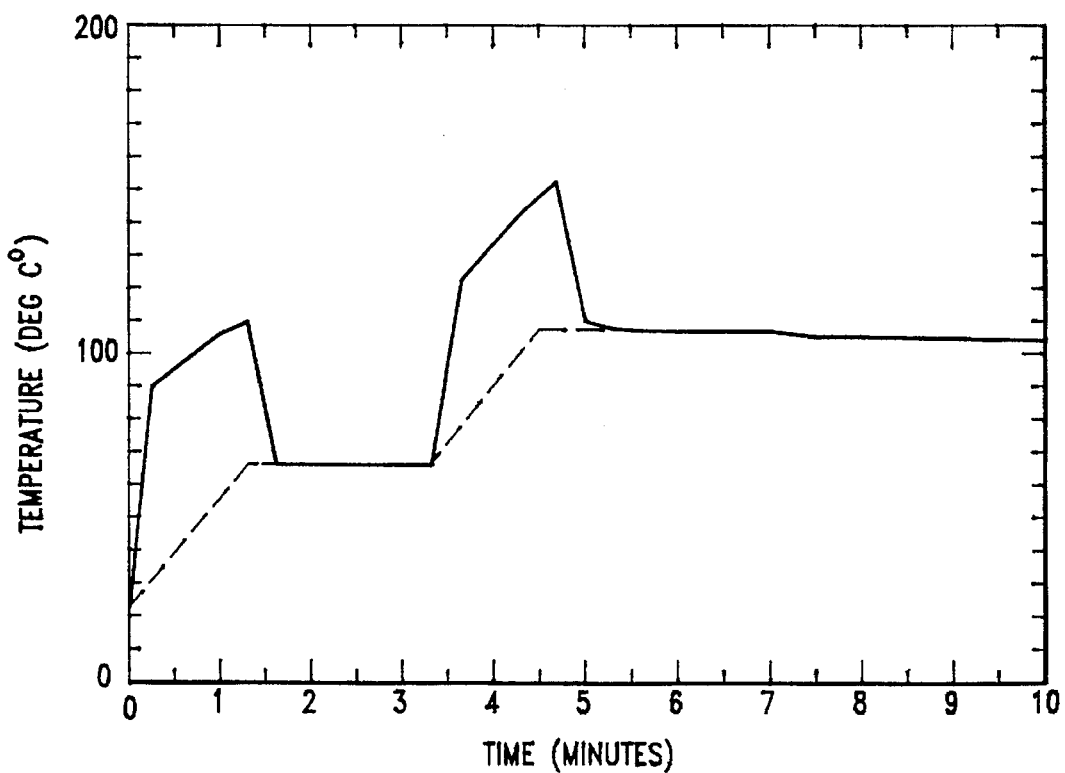
FIG. 5 is a graphical representation showing the results of a lamp heating test on a 25 wafer lot processed with the vapor reactor, all in accordance with the present invention.

In addition to the above example, a lamp heating test was performed on a 25 wafer lot. FIG. 5 shows the temperature rise measured in the center of the middle wafer, which is the coldest location of the lot. Two 80 second heating cycles were applied to the wafers to raise the temperature from 28 degC. to 67 degC. and from 67 degC. to 107 degC., respectively (at a rate of about 0.5 deg/sec). The overshooting (indicated by data point plotted above the dashed lines in FIG. 5) of the registered temperatures during the two heating periods was due to the high IR absorbance of the thermocouple pad used. The heating rate is an order of magnitude faster than is achieved with conventional furnace heating.

Note that the use of this type of apparatus is not limited to the method described in Jeng et al. Another semiconductor application would be to remove hydrocarbon residues such as photoresists or polymers by providing chemical exposure (e.g. ozone) on wafer surfaces at elevated temperatures. In general, this type of chamber can easily be used for a variety of preclean and post-clean processes as well as for oxide removal.

In summary, a reactor is provided with the capability for rapid thermal treatment before, during, or after the reaction process. The apparatus can uniformly process multiple wafers at once. The unique and flexible arrangement of heating devices and integrated cooling of the apparatus of the present invention can provide fast process turnaround.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. An apparatus for controlled temperature treatment of a batch of semiconductor wafers in a sealed environment, comprising:

a sealed chamber with at least one wall for receiving the wafers, the chamber having a gas inlet port and a gas outlet port;

at least one tube for receiving a heating means for heating the wafers, the tube passing from outside the chamber to inside the chamber without breaking the seal of the chamber;

a tube cooling means connected to the tube, the tube cooling means including a source of coolant, a connection fitted to the end of the tube for admitting the coolant to the tube, and a quick disconnect fitted to the tube between the connection and the chamber wall; and a cooling means attached to the chamber for cooling the chamber wall.

2. The apparatus of claim 1 wherein the tube has at least one open end.

3. The apparatus of claim 1 wherein the heating means is positioned in the tube, and the heating means is a lamp.

4. The apparatus of claim 3 wherein the lamp is an infrared lamp.

5. The apparatus of claim 1 wherein the coolant is dry nitrogen.

6. The apparatus of claim 1 wherein the cooling means is a Jacketed cooling line on contact with the chamber wall.

7. The apparatus of claim 1 wherein a plurality of tubes are provided and the tubes are positioned roughly symmetrically around the perimeter of the chamber, proximate the chamber wall.

8. The apparatus of claim 1 wherein the tube is constructed from a transparent material.

9. The apparatus of claim 1 wherein the transparent material is quartz.

10. The apparatus of claim 1 wherein a portion of a surface of the tube proximate the chamber wall is coated with a reflective coating for reflecting light and heat towards the center of the chamber while a remainder of the tube surface facing away from the chamber wall is uncoated to allow the passage of light and heat towards the center of the chamber.

11. The apparatus of claim 1 wherein the inside of the chamber wall is a reflective surface for reflecting light and heat towards the center of the chamber.

12. The apparatus of claim 1 wherein the inside of the chamber wall is coated with a protective coating.

13. The apparatus of claim 12 wherein the protective coating is teflon.

14. The apparatus of claim 1 further comprising:

a wafer rack for holding the semiconductor wafers; and an elevating means for inserting the wafer rack into the chamber.

15. A method of controllably temperature heating a batch of semiconductor wafers in a sealed environment, comprising the steps of:

placing the wafers in a sealed chamber having a wall;

admitting a reactant gas to the chamber;

cooling the chamber walls while carrying on a reaction in the chamber which leaves a residue on the wafers which is removable by desorption;

controlling the temperature of the wafers and the chamber wall during the reaction with a heating means positioned in at least one tube passing from outside the chamber into the inside of the chamber without breaking the seal of the chamber and a cooling means attached to the chamber wall; and heating the workpiece after the reaction is complete to desorb the residue.

16. The method of claim 15 wherein the heating means is at least one lamp.

17. The method of claim 15 wherein the tube has at least one open end.

18. The method of claim 17 wherein the heating means is capable of being removed through the open end of the tube.

19. The method of claim 15 wherein the cooling means controls the temperature around a periphery of the chamber.

20. The method of claim 15 wherein the cooling means is a jacketed cooling line in contact with the chamber wall.

* * * * *